(12) United States Patent
Haukness (10) Patent No.: US 11,373,704 B2
(45) Date of Patent: Jun. 28, 2022

(54) SYSTEM AND METHOD FOR PERFORMING MEMORY OPERATIONS IN RRAM CELLS

(71) Applicant: HEFEI RELIANCE MEMORY LIMITED, Hefei (CN)

(72) Inventor: Brent Steven Haukness, Monte Sereno, CA (US)

(73) Assignee: Hefei Reliance Memory Limited, Hefei (CN)

( * ) Notice: Subject to any disclaimer, the term of this patent is extended or adjusted under 35 U.S.C. 154(b) by 29 days.

(21) Appl. No.: 16/890,933

(22) Filed: Jun. 2, 2020

(65) Prior Publication Data

US 2020/0294589 A1 Sep. 17, 2020

Related U.S. Application Data

(63) Continuation of application No. 16/264,438, filed on Jan. 31, 2019, now Pat. No. 10,714,173, which is a continuation of application No. 15/393,233, filed on Dec. 28, 2016, now Pat. No. 10,236,059, which is a continuation of application No. 14/240,682, filed as application No. PCT/US2012/050368 on Aug. 10, 2012, now Pat. No. 9,570,164.

(60) Provisional application No. 61/527,090, filed on Aug. 24, 2011.

(51) Int. Cl.
G11C 13/00 (2006.01)

(52) U.S. Cl.
CPC ...... *G11C 13/0026* (2013.01); *G11C 13/0002* (2013.01); *G11C 13/004* (2013.01); *G11C 13/0028* (2013.01); *G11C 13/0061* (2013.01); *G11C 13/0069* (2013.01); *G11C 13/0097* (2013.01); *G11C 2013/0088* (2013.01); *G11C 2213/79* (2013.01)

(58) Field of Classification Search
CPC .................................................. G11C 13/0002
USPC .......................................................... 365/148
See application file for complete search history.

(56) References Cited

U.S. PATENT DOCUMENTS

| | | | |
|---|---|---|---|
| 7,518,903 B2 | 4/2009 | Shirahama et al. | |
| 8,243,496 B2 | 8/2012 | Kim | |
| 9,570,164 B2 | 2/2017 | Haukness | |
| 10,236,059 B2 | 3/2019 | Haukness | |
| 2005/0117397 A1* | 6/2005 | Morimoto | G11C 13/0069 365/185.21 |
| 2005/0201182 A1 | 9/2005 | Osada et al. | |
| 2008/0175036 A1 | 7/2008 | Oh et al. | |

(Continued)

OTHER PUBLICATIONS

PCT International Search Report and the Written Opinion dated Jan. 29, 2013, issued in related International Application No. PCT/US2012/050368 (7 pages).

(Continued)

*Primary Examiner* — Anthan Tran
(74) *Attorney, Agent, or Firm* — Sheppard Mullin Richter & Hampton LLP (57) ABSTRACT

A resistive RAM (RRAM) device has a bit line, a word line, a source line carrying a bias voltage that is a substantially static and non-negative voltage, an RRAM cell, and a bit line control coupled to the bit line circuit. The RRAM cell includes a gate node coupled to the word line, a bias node coupled to the source line, and a bit line node coupled to the bit line. The bit line control circuit is configured to generate non-negative command voltages to perform respective memory operations on the RRAM cell.

20 Claims, 8 Drawing Sheets

(56) References Cited

U.S. PATENT DOCUMENTS

| | | | |
|---|---|---|---|
| 2008/0316821 A1 | 12/2008 | Yokoi | |
| 2009/0067229 A1 | 3/2009 | Kang et al. | |
| 2009/0135637 A1 | 5/2009 | Takase | |
| 2010/0027315 A1* | 2/2010 | Kim | G11C 8/12 365/148 |
| 2010/0039861 A1 | 2/2010 | Park et al. | |
| 2010/0054017 A1* | 3/2010 | Maejima | G11C 13/0021 365/148 |
| 2010/0080038 A1 | 4/2010 | Awaya et al. | |
| 2010/0110763 A1 | 5/2010 | Li et al. | |
| 2010/0124095 A1 | 5/2010 | Jung et al. | |
| 2010/0321981 A1 | 12/2010 | Jeon et al. | |
| 2011/0103134 A1 | 5/2011 | Oh et al. | |
| 2012/0020141 A1 | 1/2012 | Kitagawa et al. | |

OTHER PUBLICATIONS

PCT International Preliminary Report on Patentability dated Mar. 6, 2014, issued in related International Application No. PCT/US2012/050368 (6 pages).

Non-Final Office Action dated Mar. 26, 2015, issued in related U.S. Appl. No. 14/240,682 (11 pages).

Final Office Action dated Oct. 20, 2015, issued in related U.S. Appl. No. 14/240,682 (13 pages).

Non-Final Office Action dated Mar. 10, 2016, issued in related U.S. Appl. No. 14/240,682 (14 pages).

Final Office Action dated Aug. 23, 2016, issued in related U.S. Appl. No. 14/240,682 (15 pages).

Notice of Allowance dated Dec. 16, 2016, issued in related U.S. Appl. No. 14/240,682 (8 pages).

Office Action dated Jan. 5, 2017, issued in related Taiwan Application No. 101130885, with English machine translation (18 pages).

Office Action dated Aug. 10, 2016, issued in related Taiwan Application No. 101130885, with English machine translation (15 pages).

Office Action dated Mar. 28, 2018, issued in related Taiwan Application No. 106122629, with English machine translation (18 pages).

Office Action and Search Report dated Feb. 14, 2020, issued in related Taiwan Application No. 106122629, with English machine translation (22 pages).

Office Action and Search Report dated May 24, 2021, issued in related Taiwan Application No. 109116041 with English machine translation (23 pages).

Non-Final Office Action dated Dec. 12, 2019, issued in related U.S. Appl. No. 16/264,438 (13 pages).

Notice of Allowance dated Mar. 5, 2020, issued in related U.S. Appl. No. 16/264,438 (8 pages).

Non-Final Office Action dated Oct. 20, 2017, issued in related U.S. Appl. No. 15/393,233 (12 pages).

Final Office Action dated Feb. 23, 2018, issued in related U.S. Appl. No. 15/393,233 (12 pages).

Non-Final Office Action dated Jun. 18, 2018, issued in related U.S. Appl. No. 15/393,233 (12 pages).

Notice of Allowance dated Oct. 31, 2018, issued in related U.S. Appl. No. 15/393,233 (8 pages).

\* cited by examiner

SYSTEM AND METHOD FOR PERFORMING MEMORY OPERATIONS IN RRAM CELLS

CROSS REFERENCE TO RELATED APPLICATIONS

This Application is a continuation of U.S. patent application Ser. No. 16/264,438, filed on Jan. 31, 2019, which is a continuation of U.S. patent application Ser. No. 15/393,233, filed on Dec. 28, 2016, now U.S. Pat. No. 10,236,059, which is a continuation of U.S. patent application Ser. No. 14/240,682, filed on Feb. 24, 2014, now U.S. Pat. No. 9,570,164, which is a United States National Stage Application filed under 35 U.S.C. § 371 of PCT Patent Application No. PCT/US2012/050368, filed on Aug. 10, 2012, which claims benefit of and priority to U.S. Provisional Patent Application No. 61/527,090, filed on Aug. 24, 2011, all of which are hereby incorporated by reference in their entirety for all purposes.

BACKGROUND

Figure 1:
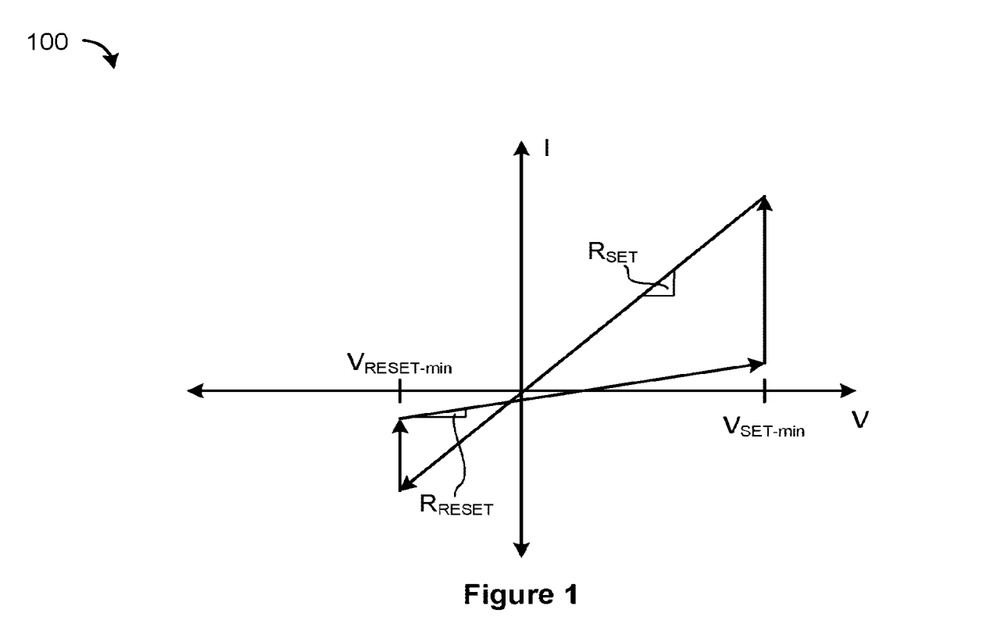
FIG. 1 is a graph illustrating current versus voltage characteristics for an exemplary RRAM cell.

Resistive RAM (RRAM) cells are memory devices that store data based on the resistance of the RRAM cell (i.e., the resistance between electrodes of the RRAM cell). For example, a RRAM cell in a low resistance state (referred to as a "SET" state) may correspond to a logic "1" and a RRAM cell in a high resistance state (referred to as a "RESET" state) may correspond to a logic "0." Many types of RRAM cell technologies require bipolar voltages to place the RRAM cells in a particular state. For example, applying a positive voltage across the terminals of the RRAM cell places the RRAM cell in a SET state. In contrast, applying a negative voltage across the terminals of the RRAM cell places the RRAM cell in the RESET state. FIG. 1 is a graph 100 illustrating current versus voltage characteristics for an exemplary RRAM cell, according to some embodiments. As illustrated in FIG. 1, $V_{SET-min}$ is a minimum positive voltage across the terminals of the RRAM cell (e.g., +0.25V) that is required to place the RRAM cell in the SET state and $V_{RESET-min}$ is a minimum negative voltage across the terminals of the RRAM cell (e.g., −0.08V) that is required to place the RRAM cell in the RESET state. When the RRAM cell is in the RESET state, the resistance of the RRAM cell is $R_{RESET}$ (e.g., 1M Ohms) and when the RRAM cell is in the SET state, the resistance of the RRAM cell is $R_{SET}$ (e.g., 10K Ohms).

For performance reasons, it would be desirable to be able to set and reset different cells in an array of RRAM cells concurrently. However, since bipolar voltages are required to set and reset existing RRAM cells, negative voltage charge pumps are required, which complicates the design of the array of RRAM cells. Thus, it would be highly desirable to provide an array of RRAM cells in which different RRAM cells coupled to the same word line can be set and reset concurrently without using negative voltages. It would also be desirable to read and write RRAM cells coupled to the same word line in the array of RRAM cells without having to change biasing conditions.

BRIEF DESCRIPTION OF THE DRAWINGS

Like reference numerals refer to corresponding parts throughout the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the present invention. However, it will be apparent that embodiments of the subject matter disclosed herein may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first node could be termed a second node, and, similarly, a second node could be termed a first node, without departing from the scope of the present invention. The first node and the second node are both nodes, but they are not the same node.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Some embodiments, described below, provide a biasing technique for RRAM cells in an array of RRAM cells that allows distinct memory operations to be concurrently performed on separate and distinct RRAM cells in a particular word line of the array of RRAM cells. For example, using the techniques described herein, separate and distinct RRAM cells "on a particular word line" (i.e., separate and distinct RRAM cells coupled to the same particular word line) of the array of RRAM cells may be concurrently set (i.e., placed in the SET state) and reset (i.e., placed in the RESET state). Similarly, using the techniques described herein, separate and distinct RRAM cells on a particular word line of the array of RRAM cells may be concurrently set (or reset) and read. Furthermore, a memory operation may be performed on a RRAM cell by setting the voltage on the bit line corresponding to the RRAM cell to a voltage corresponding to the memory operation.

Note that the term "RRAM device" is used in this specification to refer to one or more RRAM cells. For example, the term RRAM device may be used to refer to a single RRAM cell. The term RRAM device may also be used to refer to a plurality of RRAM cells (e.g., RRAM cells in an array of RRAM cells).

Figure 2A:
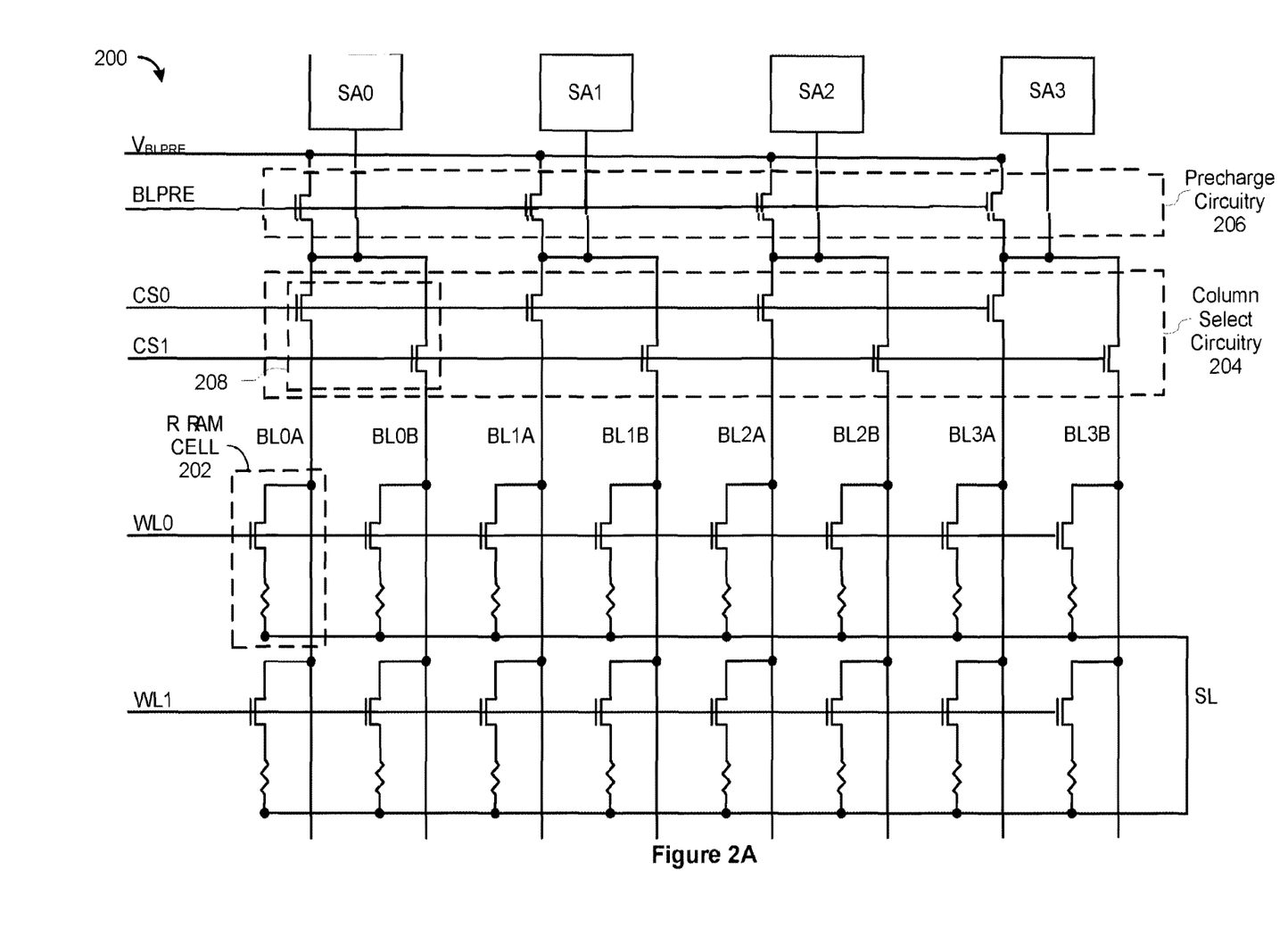
FIG. 2A is a block diagram illustrating an exemplary array of RRAM cells and associated bit line control circuits, according to some embodiments.

FIG. 2A is a block diagram 200 illustrating an exemplary array of RRAM cells (e.g., RRAM cell 202) and associated bit line control circuits (e.g., bit line control circuits SA0, SA1, SA2, and SA3), according to some embodiments.

In some embodiments, a respective bit line control circuit (e.g., bit line control circuit SA0) includes circuitry configured to generate command voltages to perform memory operations on RRAM cells. In some embodiments, the command voltages are all non-negative voltages (relative to ground). In some embodiments, a respective memory operation is selected from the group consisting of a set operation that sets respective RRAM cells (i.e., places the RRAM cells in a SET state), a reset operation that resets respective RRAM cells (i.e., places the RRAM cells in a SET state), a read operation that reads values stored in respective RRAM cells, and an inhibit operation that maintains values stored in respective RRAM cells.

In some implementations, a respective command voltage is generated by a current-limited voltage source circuit. In other words, the voltage source circuit is configured to output a predetermined voltage (e.g., the respective command voltage) until a current output by the voltage source circuit reaches a predetermined current. Once the predetermined current is reached, the voltage source circuit is configured to output the predetermined current (or a second predetermined current) instead of the predetermined voltage. For example, during a set operation for a RRAM cell that is in a RESET state, the voltage source circuit outputs a "set voltage" to a bit line to place the RRAM cell into the SET state. As the resistance of the resistive memory element of the RRAM cell decreases, the current increases proportionally to the reciprocal of the resistance of the resistive memory element. If the current output by the voltage source circuit reaches the predetermined current, the voltage source circuit is configured to output the predetermined current (or a second predetermined current).

In some embodiments, a respective bit line control circuit (e.g., bit line control circuit SA0) includes a current source circuit configured to generate substantially constant currents that are applied to the bit lines to perform memory operations. In these embodiments, the voltage of the bit line depends at least in part on the resistance of the resistive memory element in a respective RRAM cell on which the memory operation is performed. For example, during a set operation for a RRAM cell that is in a RESET state, the current source circuit outputs a substantially constant "set current" to a bit line. Although the set current is substantially constant, the voltage on the bit line decreases as the resistance decreases. Similarly, during a reset operation for a RRAM cell that is in a SET state, the current source circuit outputs a substantially constant "reset current" to the bit line. Although the "reset current" is substantially constant, the voltage on the bit line increases as the resistance increases.

In some embodiments, a respective bit line control circuit (e.g., bit line control circuit SA0) includes a sense amplifier circuit configured to sense a voltage or current on the bit line during a read operation. Sense amplifiers are well-known in the art and are not described in this specification.

In some embodiments, a respective RRAM cell in the array of RRAM cells is a three-terminal RRAM cell that includes a transistor coupled in series with a resistive memory element. The source of the transistor is coupled to a terminal of the resistive memory element, the gate of the transistor is coupled to a word line (e.g., WL0, WL1, etc.), and the drain of the transistor is coupled to a bit line (e.g., BL0A, BL0B, BL1A, BL1B, BL2A, BL2B, BL3A, BL3B, etc.). The other terminal of the resistive memory element is coupled to a source line (e.g., SL) carrying a bias voltage $V_{BIAS}$. In some other implementations, the source of the transistor is coupled to a source line, the gate of the transistor (and a gate node of the RRAM cell) is coupled to a word line, the drain of the transistor is coupled to a terminal of the resistive memory element, and the other terminal of the resistive memory element is coupled to the bit line. In some embodiments, the bias voltage is a substantially static (i.e., the voltage does not substantially change with time) and non-negative voltage (i.e., non-negative relative to ground) during a memory operation. In some embodiments, the bias voltage (i.e., $V_{BIAS}$) is a positive voltage having a magnitude that is greater than or equal to the magnitude of the minimum negative voltage across the terminals of the RRAM cell required to place a RRAM cell in the RESET state (i.e., the magnitude of $V_{RESET-min}$). By using a substantially static and non-negative bias voltage on the source line, negative voltages and associated negative voltage charge pumps are no longer required. In this context, a "substantially static" voltage (e.g., the substantially static bias voltage) may be a voltage that includes dynamic variations that is within a predetermined range (e.g., 5%) of a nominal static voltage. For example, if the nominal static voltage is 5V, the substantially static voltage is within a range of 4.75V to 5V. The following embodiments illustrate how the use of the substantially static and non-negative voltage on the source line obviates the need for negative voltages and associated negative voltage charge pumps.

In some embodiments, a set voltage (i.e., an applied set voltage $V_{SET}$) generated by a bit line control circuit for the set operation is positive relative to the bias voltage. For example, if the minimum voltage across the terminals of the RRAM cell that is required to place a RRAM cell into the RESET state (i.e., $V_{RESET-min}$) is −0.08V across the terminals of the resistive memory element and the minimum voltage across the terminals of the RRAM cell that is required to place the RRAM cell into the SET state (i.e., $V_{SET-min}$) is +0.25V across the terminals of the resistive memory element, the bias voltage (i.e., $V_{BIAS}$) is +0.08V relative to ground and the set voltage (i.e., $V_{SET}$) is at least +0.33V (i.e., 0.25V+0.08V) relative to ground. Both the bias voltage and the set voltage are non-negative relative to ground. Note that when the set voltage is +0.33V relative to ground and the bias voltage is +0.08V relative to ground, the voltage across the terminals of the resistive memory element is +0.25V (i.e., 0.33V-0.08V), which is the minimum voltage required to place the RRAM cell into the SET state. As discussed above, $V_{RESET-min}$ is the minimum negative voltage across the terminals of the RRAM cell that is required to place the RRAM cell in the RESET state. Accordingly, in some implementations, the bias voltage (i.e., $V_{BIAS}$) is set to a value that is greater than the magnitude of $V_{RESET-min}$. In some embodiments, when the RRAM cell is to be placed in the SET state, the voltage across the terminals of the RRAM cell is greater than or equal to the minimum positive voltage across the terminals of the RRAM cell that is required to place the RRAM cell in the SET state (i.e., $V_{SET-min}$). Accordingly, an applied set voltage (i.e., $V_{SET}$) is greater than or equal to the bias voltage ($V_{BIAS}$) plus the minimum positive voltage required to place the RRAM cell in the SET state (i.e., $V_{SET-min}$). For example, if the bias voltage is 0.1V, $V_{SET-min}$ is 0.25V, and the applied set voltage ($V_{SET}$) is 0.4V, then the voltage across the terminals of the RRAM cell is 0.3V, which is 0.05V greater than the minimum positive voltage across the terminals of the RRAM cell that is required to place the RRAM cell in the SET state (i.e., $V_{SET-min}$).

In some embodiments, a reset voltage (i.e., an applied reset voltage $V_{RESET}$) generated by a bit line control circuit for the reset operation is negative relative to the bias voltage (i.e., $V_{BIAS}$). For example, if the minimum negative voltage across the terminals of the RRAM cell that is required to place a RRAM cell into the RESET state (i.e., $V_{RESET-min}$) is −0.08V across the terminals of the resistive memory element, the bias voltage ($V_{BIAS}$) is at least +0.08V relative to ground when the reset voltage (i.e., $V_{RESET}$) is 0V (i.e., ground). Both the bias voltage and the reset voltage are non-negative relative to ground. Note that when the reset voltage is 0V and the bias voltage is +0.08V relative to ground, the voltage across the terminals of the resistive memory element is −0.08V (i.e., 0V-0.08V), which is the minimum negative voltage across the terminals of the RRAM cell that is required to place the RRAM cell into the RESET state. As discussed above, $V_{RESET-min}$ is the minimum negative voltage across the terminals of the RRAM cell that is required to place the RRAM cell in the RESET state. Accordingly, in some implementations, the bias voltage (i.e., $V_{BIAS}$) is set to a value that is greater than the magnitude of $V_{RESET-min}$. Thus, when the bias voltage is greater than the magnitude of $V_{RESET-min}$ and the RRAM cell is to be placed in the RESET state, the voltage across the terminals of the RRAM cell is less than or equal to the minimum negative voltage across the terminals of the RRAM cell that is required to place the RRAM cell into the RESET state (i.e., $V_{RESET-min}$). In other words, the voltage across the terminals of the RRAM cell is a more negative voltage. For example, when the bias voltage ($V_{BIAS}$) is 0.1V and the applied reset voltage ($V_{RESET}$) is 0V, the voltage across the terminals of the RRAM cell is −0.1V (i.e., 0V-0.1V), which is 0.02V more negative than the minimum negative voltage across the terminals of the RRAM cell that is required to place the RRAM cell in the RESET state (i.e., $V_{RESET-min}$).

In some embodiments, a read voltage (i.e., an applied read voltage $V_{READ}$) generated by a bit line control circuit for the read operation is a positive voltage relative to the bias voltage (i.e., $V_{BIAS}$). In an example in which the minimum negative voltage across the terminals of the RRAM cell to place a RRAM cell into the RESET state (i.e., $V_{RESET-min}$) is −0.08V and the minimum positive voltage across the terminals of the RRAM cell to read the RRAM cell is +0.04V, the bias voltage (i.e., $V_{BIAS}$) is set to +0.08V relative to ground, the minimum read voltage (i.e., $V_{READ}$) applied to the bitline to read the RRAM cell is +0.12V (i.e., 0.04V+0.08V). Both the bias voltage and the read voltage are non-negative relative to ground. When the read voltage applied to the bitline is +0.12V relative to ground and the bias voltage is +0.08V relative to ground, the voltage across the terminals of the resistive memory element is 0.04V (i.e., 0.12V-0.08V), which is equal to the minimum positive voltage across the terminals of the RRAM cell to read the RRAM cell (i.e., $V_{READ-min}$). In this example, the read voltage (i.e., $V_{READ}$) generated by the bit line control circuit for the read operation is a positive voltage relative to the bias voltage and is a positive voltage relative to ground. Furthermore, when a read operation is performed on the RRAM cell, the applied read voltage ($V_{READ}$) is set to a voltage that provides a voltage across the terminals of the RRAM cell greater than or equal to the minimum positive voltage to read the RRAM cell (i.e., $V_{READ-min}$) and less than the minimum positive voltage across the terminals of the RRAM cell that is required to place the RRAM cell in the SET state (i.e., $V_{SET-min}$). Typically. $V_{READ}$ is set so that the voltage across the terminals of the RRAM cell is between $V_{READ-min}$ and a predetermined voltage below $V_{SET-min}$ (e.g., 10% below $V_{SET-min}$, 0.1V below $V_{SET-min}$).

In other embodiments, a read voltage (i.e., an applied read voltage $V_{READ}$) generated by a bit line control circuit for the read operation is a negative voltage relative to the bias voltage (i.e., $V_{BIAS}$). In an example in which the minimum negative voltage across the terminals of the RRAM cell to place a RRAM cell into the RESET state (i.e., $V_{RESET-min}$) is −0.08V and the smallest-magnitude negative voltage across the terminals of the RRAM cell to read the RRAM cell is −0.03V, the bias voltage (i.e., $V_{BIAS}$) is set to +0.08V relative to ground and the maximum read voltage (i.e., $V_{READ}$) applied to the bitline to read the RRAM cell is +0.05V (i.e., 0.08V-0.03V). Both the bias voltage and the read voltage are non-negative relative to ground. When the read voltage applied to the bitline is +0.05V relative to ground and the bias voltage is +0.08V relative to ground, the voltage across the terminals of the resistive memory element is −0.03V (i.e., 0.05V-0.08V), which is equal to the smallest-magnitude negative voltage across the terminals of the RRAM cell to read the RRAM cell (i.e., $V_{READ-min}$). In this example, the read voltage (i.e., $V_{READ}$) generated by the bit line control circuit for the read operation is a negative voltage relative to the bias voltage and is a positive voltage relative to ground. Furthermore, when a read operation is performed on the RRAM cell, the applied read voltage ($V_{READ}$) is set to a voltage that provides a negative voltage across the terminals of the RRAM cell whose magnitude is greater than or equal to the smallest-magnitude negative voltage to read the RRAM cell (i.e., $V_{READ-min}$) and whose magnitude is less than the smallest-magnitude negative voltage across the terminals of the RRAM cell to place the RRAM cell in the RESET state (i.e., $V_{RESET-min}$). Typically. $V_{READ}$ is set so that the magnitude of the negative voltage across the terminals of the RRAM cell is within a range extending from the magnitude of $V_{READ-min}$ to a predetermined magnitude smaller than the magnitude of $V_{RESET-min}$ (e.g., $|V_{SET-min}|-0.1V$ or $|V_{SET-min}|-10\%$).

In some embodiments, an inhibit voltage generated by a bit line control circuit for the inhibit operation is substantially equal to the bias voltage (i.e., $V_{BIAS}$). For example, if the voltage that is sufficient to place a RRAM cell into the RESET state is $-0.08V$ across the terminals of the resistive memory element, both the bias voltage (i.e., $V_{BIAS}$) and the inhibit voltage (i.e., $V_{INHIBIT}$) are, ideally, $+0.08V$. More generally, the bias voltage and inhibit voltage are substantially equal (e.g., the same within 0.01 volts, or within 10 percent), and the bias voltage has a magnitude, relative to ground, that is no less than the voltage sufficient to place a RRAM cell into the RESET state (e.g., the bias voltage is between 0.08V and 0.10V). Both the bias voltage and the inhibit voltage are non-negative relative to ground. When both the inhibit voltage and the bias voltage are $+0.08V$ relative to ground, the voltage across the terminals of the resistive memory element is 0V (i.e., 0.08V-0.08V). Thus, the inhibit operation is an operation in which the RRAM cell maintains its previous state. In other words, the inhibit operation is a "no-op" operation.

Note that although the above examples refer to specific values of $V_{RESET-min}$, $V_{SET-min}$, $V_{READ-min}$, $V_{BIAS}$, $V_{SET}$, $V_{RESET}$, $V_{READ}$, and $V_{INHIBIT}$, the actual values of these voltages depend on characteristics of the RRAM cell (e.g., the structure of the RRAM cell, the manufacturing process of the RRAM cell, the materials used to manufacture the RRAM cell, etc.).

In some embodiments, the set voltage (i.e., $V_{SET}$) is greater than the read voltage (i.e., $V_{READ}$), and the read voltage is less than the inhibit voltage (i.e., $V_{INHIBIT}$) and positive relative to ground.

In some embodiments, the set voltage (i.e., $V_{SET}$) is greater than the read voltage ($V_{READ}$), and the read voltage is greater than the inhibit voltage (i.e., $V_{INHIBIT}$).

In some embodiments, the inhibit voltage (i.e., $V_{INHIBIT}$) is greater than the minimum voltage across the terminals of the RRAM cell that is required to place the RRAM cell in the RESET state (i.e., $V_{RESET-min}$) and is less than the minimum voltage across the terminals of the RRAM cell that is required to place the RRAM cell in the SET state (i.e., $V_{SET-min}$).

Figure 2B:
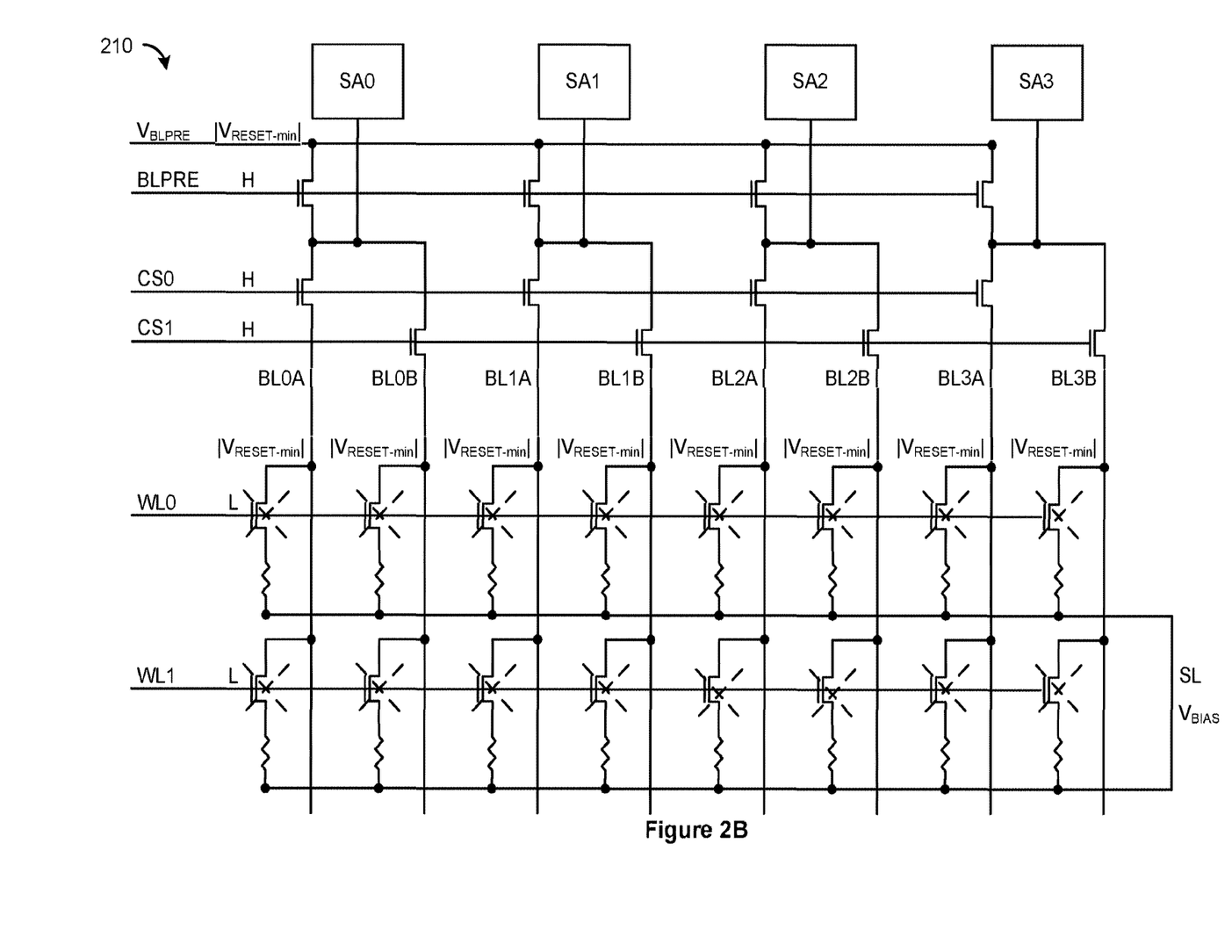
FIG. 2B is a block diagram illustrating an exemplary precharge phase for the array of RRAM cells illustrated in FIG. 2A, according to some embodiments.
Figure 2C:
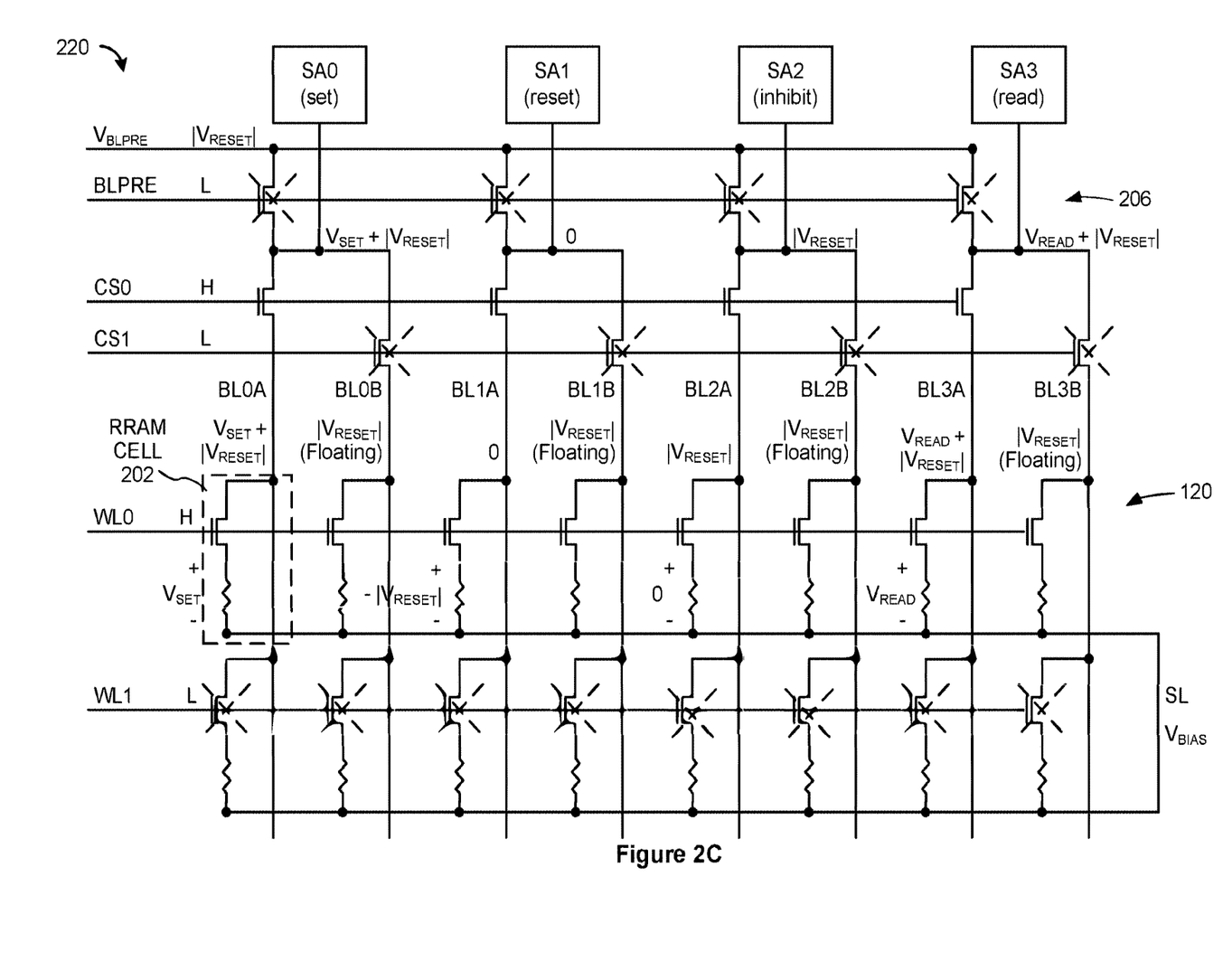
FIG. 2C is a block diagram illustrating an exemplary memory operation phase for the array of RRAM cells illustrated in FIG. 2A, according to some embodiments.

In some embodiments, the array of RRAM cells includes column select circuitry 204. In these embodiments, column select signals CS0 and CS1 are used to select (i.e., multiplex) bit lines on which to perform memory operations. For example, if the column select signal CS0 is enabled (e.g., high) and the column select signal CS1 is disabled (e.g., low), memory operations may be performed on bit lines BL0A, BL1A, BL2A, and BL3A (but not on bit lines BL0B, BL1B, BL2B, and BL3B). Although FIGS. 2A, 2B, and 2C illustrate n-channel MOSFETs for the column select circuitry 204, other types of column select circuitry may be used. For example, the pass gates may be used instead of n-channel MOSFETs. Furthermore, although FIGS. 2A, 2B, and 2C illustrate the column select signals CS0 and CS1 running parallel to the word lines (e.g., WL0 and WL1), in some implementations, the column select signals CS0 and CS1 run parallel to the bit lines. In some embodiments, the column select signals are one-hot signals (i.e., one column select signal is enabled and the rest are disabled) during memory operations; however, in some embodiments, all the column select signals are concurrently enabled (e.g., high) during precharge operations. Also note that although FIG. 2A illustrates a two-to-one multiplexer 208 for each bit line control circuit, a multiplexer of any size may be used to multiplex bit lines to a particular bit line control circuit. For example, a four-to-one multiplexer may be used to multiplex four bit lines to a single bit line control circuit.

In some embodiments, the array of RRAM cells includes precharge circuitry 206 configured to precharge the bit lines to a predetermined voltage (e.g., $V_{BLPRE}$). For example, the precharge circuitry may include a transistor controlled by a precharge control signal (e.g., the BLPRE signal). When the BLPRE signal is high, the bit lines are coupled to the predetermined voltage and are precharged to substantially the predetermined voltage. Note that depending on the type of precharge circuitry used, the bit lines may not reach the predetermined voltage. For example, when the precharge circuitry 206 includes n-channel MOSFETs and the precharge circuitry 206 precharges the bit lines, the voltage of the bit lines reaches the smaller of (1) one threshold voltage below the voltage of the precharge control signal BLPRE and (2) $V_{BLPRE}$. In contrast, when the precharge circuitry 206 includes p-channel MOSFETs (or pass gates) and the precharge circuitry 206 precharges the bit lines, the voltage of the bit lines reaches $V_{BLPRE}$. In some embodiments, the predetermined voltage is the bias voltage (i.e., $V_{BIAS}$). For example, $V_{BLPRE}$ may be $+0.08V$ (e.g., $V_{RESET-min}$ in the examples presented above). Alternatively, the predetermined voltage is substantially the same as the bias voltage (i.e., $V_{BIAS}$), but can differ from the bias voltage by as much as 50% (e.g., $\pm 0.04V$).

Figure 2D:
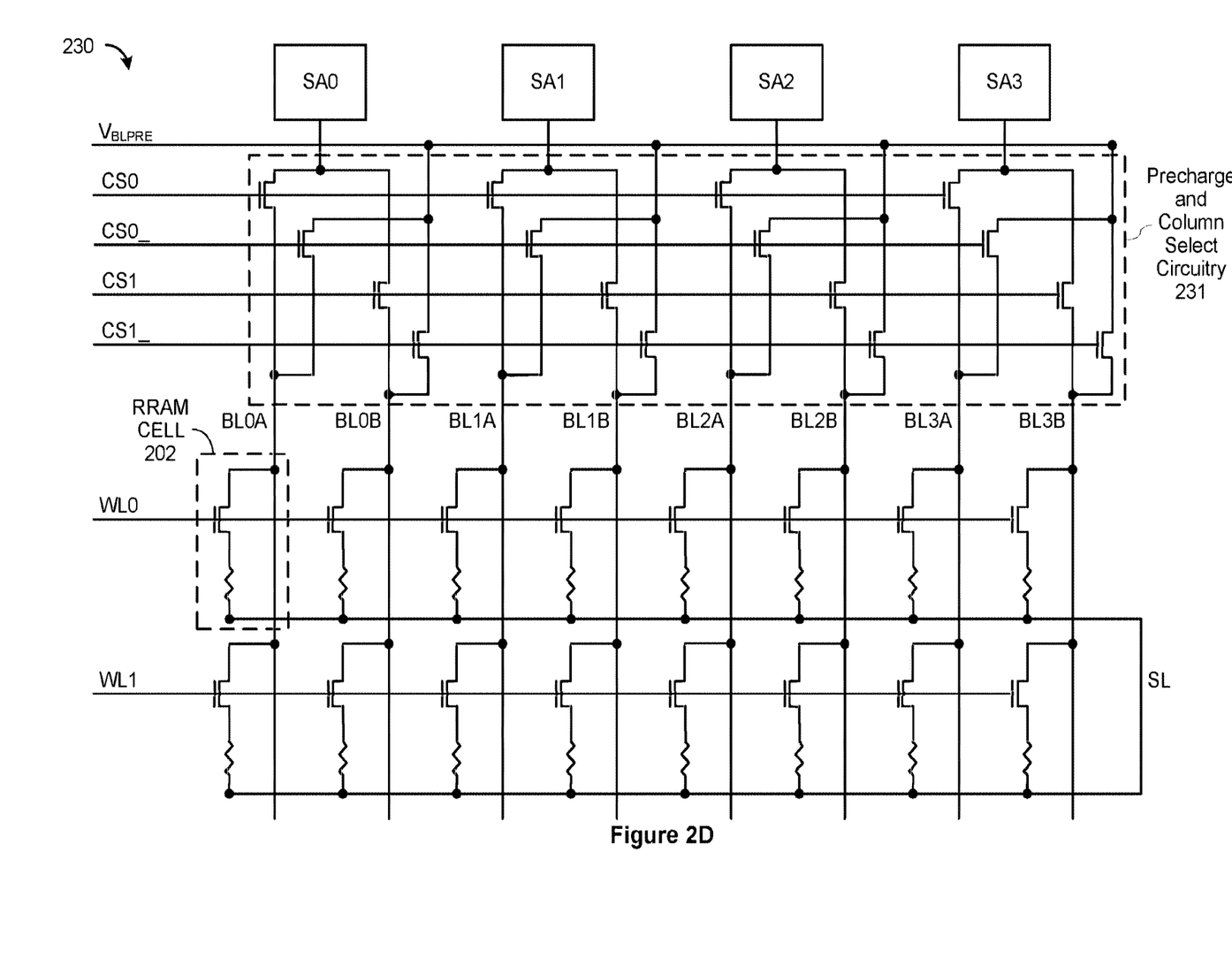
FIG. 2D is a block diagram illustrating alternative precharge and column select circuitry for the array of RRAM cells illustrated in FIG. 2A, according to some embodiments.

Reference is now made to FIG. 2D, which is a block diagram illustrating precharge and column select circuitry 231 for the array of RRAM cells illustrated in FIG. 2A, according to some embodiments. In contrast to the precharge circuitry 206 and the column select circuitry 204 in FIGS. 2A, 2B, and 2C, the precharge and column select circuitry 231 includes a precharge device for each bit line. Accordingly, in the embodiments illustrated in FIG. 2D, the bit lines that are not selected may be actively precharged (e.g., precharged to $V_{BLPRE}$ or precharged substantially to $V_{BLPRE}$, as described above with reference to FIG. 2A) instead of floating as in FIGS. 2A, 2B, and 2C. For example, if BL0A, BL1A, BL2A, and BL3A are selected (i.e., CS0 is high and CS1 is low), BL0B, BL1B, BL2B, and BL3B are precharged substantially to $V_{BLPRE}$ (i.e., CS0_ is low and CS1_ is high).

In some embodiments, the array of RRAM cells operates in two phases: a precharge phase and a memory operation phase. As with existing memory arrays, the two phases alternate (e.g., in different clock cycles or on different edges of the same clock cycle) so that a precharge phase precedes a memory operation phase. During the precharge phase, the bit lines (or a subset thereof) are precharged to the predetermined voltage (i.e., $V_{BLPRE}$). FIG. 2B is a block diagram 210 illustrating an exemplary precharge phase for the array of RRAM cells illustrated in FIG. 2A, according to some embodiments. During the precharge phase, the column select signals CS0 and CS1 and the precharge control signal BLPRE are set to a high voltage (e.g., VDD), and the word lines WL0 and WL1 are set to a low voltage (e.g., ground) so that the transistors of the RRAM cells are disabled. In doing so, the bit lines are coupled to the predetermined voltage (i.e., $V_{BLPRE}$) and are precharged to the predetermined voltage, and the resistive memory elements are isolated from the predetermined voltage.

Figure 3:
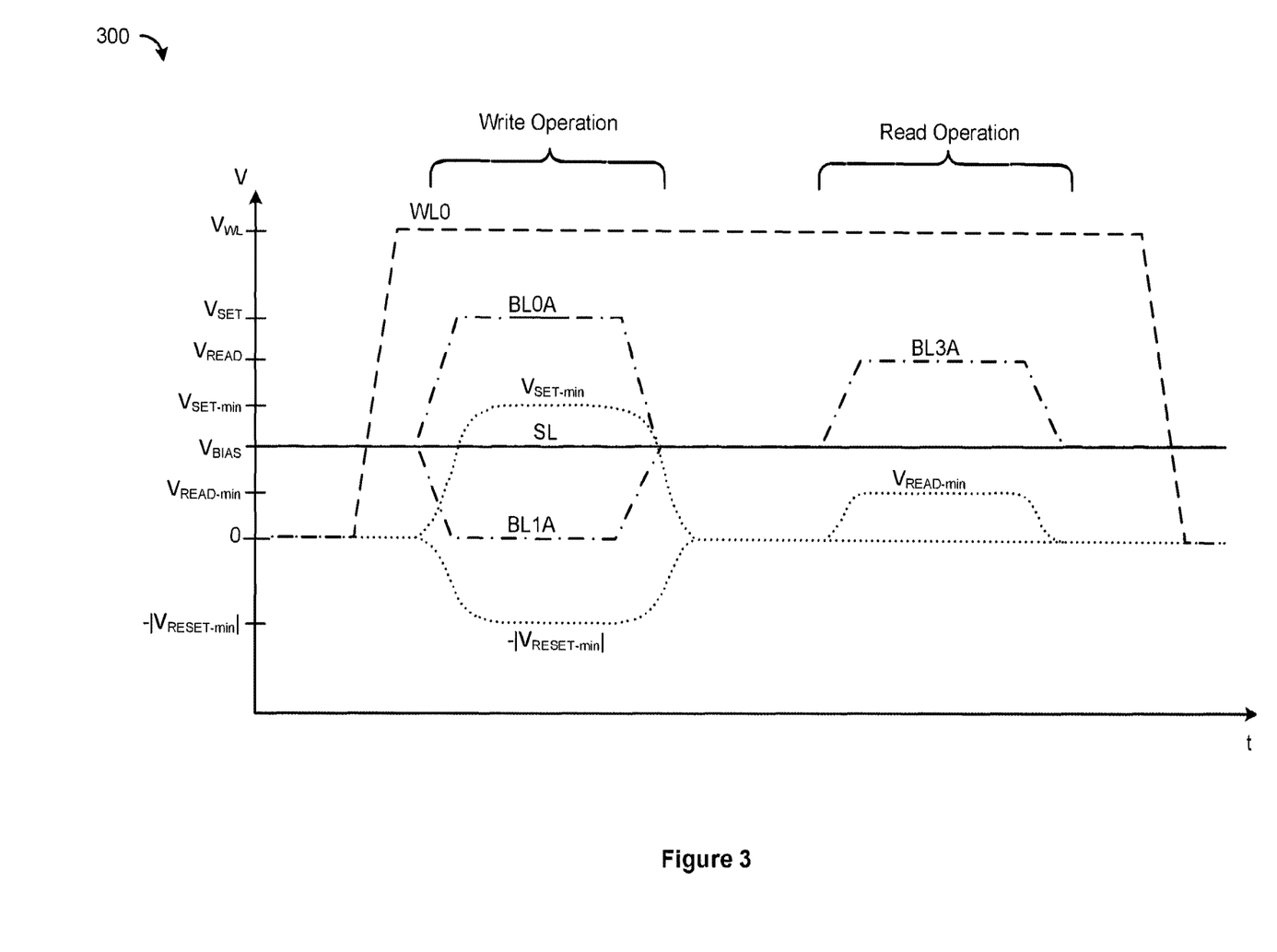
FIG. 3 is a graph illustrating exemplary voltage waveforms for the memory operations performed on the array of RRAM cells illustrated in FIG. 2C, according to some embodiments.

During the memory operation phase, one or more memory operations are performed on one or more RRAM cells in the array of RRAM cells. Reference is now made to FIGS. 2C, 3, 4, 5A and 5B. FIG. 2C is a block diagram 220 illustrating an exemplary memory operation phase for the array of RRAM cells illustrated in FIG. 2A, according to some embodiments. FIG. 3 is a graph 300 illustrating exemplary voltage waveforms for the memory operations performed on the array of RRAM cells illustrated in FIG. 2C, according to some embodiments.

Figure 5A:
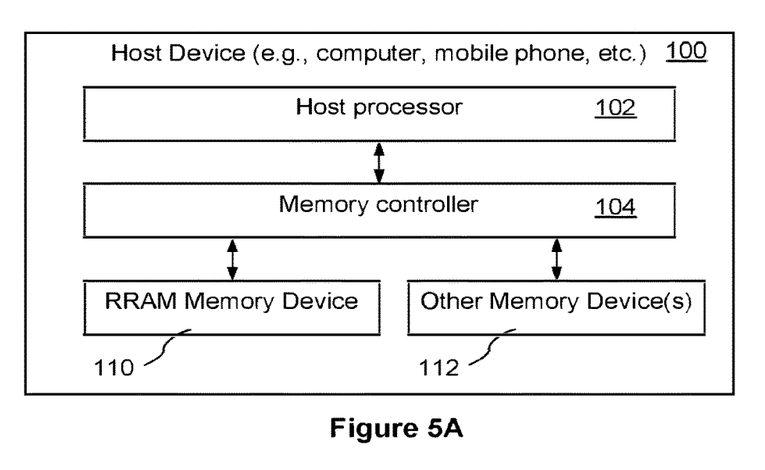
FIG. 5A is a block diagram of a computer system or electronic device that includes a RRAM memory device, according to some embodiments.

FIG. 5A depicts an example of a computer system or other electronic device (e.g., a mobile phone) 100 that includes an RRAM memory device 110 in which the memory operations are performed. The system/device 100 optionally includes a memory controller 104, which receives commands from a host processor 102, and conveys memory operation commands to the RRAM memory device 110, and optionally conveys memory operation commands to one or more other memory devices 112 as well. Alternatively, the host processor 102 communicates commands and data directly to the RRAM memory device 110.

Figure 5B:
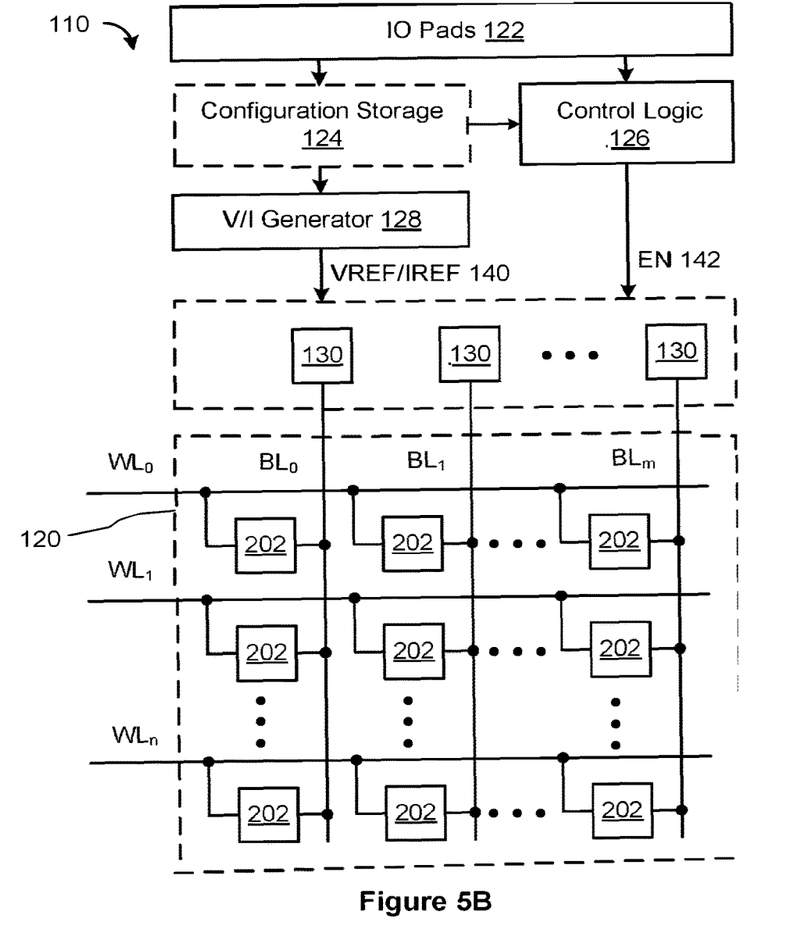
FIG. 5B is a block diagram of an RRAM memory device, according to some embodiments.

FIG. 5B is a block diagram illustrating a RRAM memory device 110, according to some embodiments. The RRAM memory device 110 includes IO pads 122 for receiving commands and data from memory controller 104, and conveying data back to memory controller 104, control logic 126, a voltage/current (V/I) generator 128, bit line control circuits 130, and one or more array 120 of RRAM cells 202. The array 120 or RRAM cells 202 correspond to the RRAM cells 202 in FIGS. 2A, 2B and 2C, and the bit line control circuit 130 corresponds to bit line control circuits SA0, SA1, SA2, and SA3 in FIGS. 2A, 2B and 2C. In some embodiments, control logic 126 comprises operation control circuitry that receives memory operation commands from a host processor 102 or memory controller 104 and carries out the internal operations required to execute the memory operations corresponding to the received memory operation commands. In some embodiments, control logic 126 includes one or more state machines for carrying out the sequences of internal operations required to perform memory operations corresponding to commands received from a host device or memory controller.

RRAM memory device 110 optionally includes configuration storage 124 for storing control settings (e.g., voltage or current control values, timing control values, mode settings) that govern operation of the RRAM memory device 110. A respective bit line control circuit 130 is coupled to one or more bit lines (e.g., bit lines BL0, BL1, . . . , BLm). A respective bit line (e.g., bit lines BL0, BL1, . . . , BLm) is coupled to one or more RRAM cells 202. A respective RRAM cell 202 is coupled to a respective word line (e.g., word lines WL0, WL1, . . . , WLn), wherein each word line is coupled to one or more RRAM cells 202.

The IO pads 122 receive data and/or memory operation commands from memory controller 104 and/or host processor 102, and convey data read from RRAM cells 202 back to the memory controller 104 or host processor 102. In some embodiments, the V/I generator 128 generates a reference voltage $V_{REF}$ (or reference current $I_{REF}$) 140 for each type of memory operation being concurrently performed in the RRAM memory device 110. For example, set operations may be performed on a first set of the RRAM cells 202 on the word line WL0 and reset operations may be performed on a second set of RRAM cells 202 on the word line WL0. Accordingly, the V/I generator 128 concurrently generates a first reference voltage $V_{REF}$ (or reference current $I_{REF}$) 140 for the set operations and generates a second reference voltage $V_{REF}$ (or reference current $I_{REF}$) 140 for the reset operations. In some embodiments, a respective bit line control circuit 130 is shared between two or more bit lines. For example, the respective bit line control circuit 130 may be shared between two bit lines via a multiplexer, as shown in FIGS. 2A, 2B and 2C.

Figure 4:
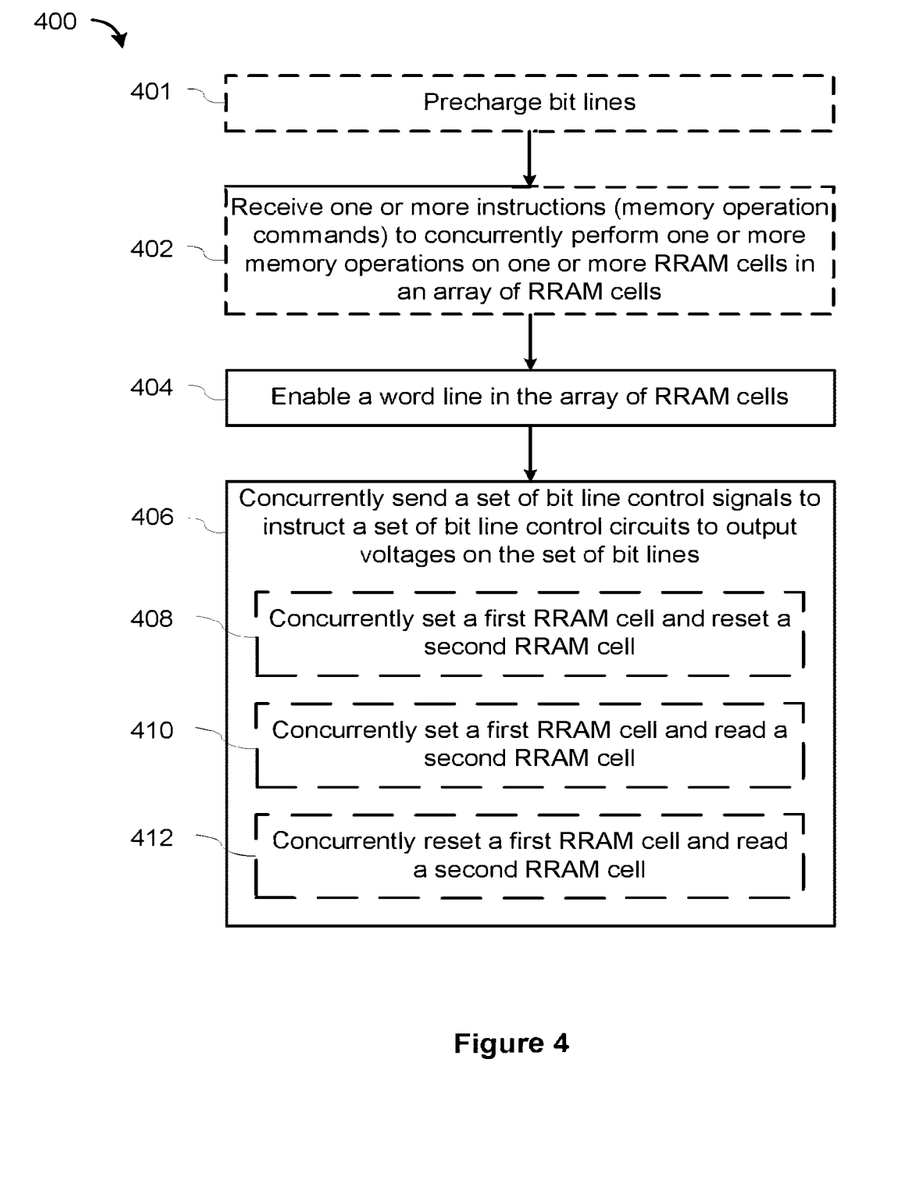
FIG. 4 is a flowchart of a method for operating an array of RRAM cells, according to some embodiments.

FIG. 4 is a flowchart of a method 400 for operating an array of RRAM cells, such as the array 120 of RRAM cells 202 shown in FIGS. 2C and 5B, according to some embodiments. While the description provided below describes the operations of method 400 as being performed by an RRAM memory device, such as the RRAM memory device 110, in some embodiments some of the operations of method 400 may be performed by, or under the control of a memory controller (e.g., memory controller 104) that controls operation of the RRAM memory device 110.

Referring to FIGS. 4, 2C and 5B, the RRAM memory device (e.g., control logic 126, FIG. 5A of RRAM memory device 110) receives (402) instructions (memory operation commands) to perform one or more memory operations on one or more RRAM cells in the array 120 of RRAM cells 202. When a received memory operation command is an instruction to write data to the one or more RRAM cells, the memory operation command typically includes data representing one or more data values to be written to the one or more RRAM cells. Optionally, a precharge operation is performed (401) prior to receiving (402) the one or more memory operation commands, or alternatively the precharge operation is performed prior to performance (404, 406) of the memory operations.

For example, the RRAM memory device receives instructions to perform the following memory operations concurrently in the array of RRAM cells: the RRAM cell at the intersection of the word line WL0 and the bit line BL0A (FIG. 2C) is to be set, the RRAM cell at the intersection of the word line WL0 and the bit line BL1A is to be reset, the RRAM cell at the intersection of the word line WL0 and the bit line BL2A is not to be operated on (i.e., an inhibit operation is being performed), and the RRAM cell at the intersection of the word line WL0 and the bit line BL3A is to be read. Note that the set and reset operations are write operations in which data is written to RRAM cells.

The RRAM memory device then enables (404) a word line in the array of RRAM cells that corresponds to RRAM cells in the RRAM array on which the memory operations are to be performed. Continuing with the example, word line WL0 is the desired word line. Thus, word line WL0 is set to a high voltage and word line WL1 is set to a low voltage. In this example, the RRAM memory device also sets the column select signal CS0 to a high voltage to and set the column select signal CS1 to a low voltage to select bitlines BL0A, BL1A, BL2A, and BL3A. Furthermore, the RRAM memory device may set the precharge control signal BLPRE to a low voltage to disable the precharge circuitry 206.

The RRAM memory device then concurrently sends (406) a set of bit line control signals to instruct a set of bit line control circuits to output voltages on a set of bit lines. In these embodiments, each bit line control circuit 130 generates a command voltage on a bit line to perform a memory operation on one or more RRAM cells, the memory operation corresponding to the respective command voltage. Continuing with the example, the RRAM memory device sends bit line control signals so that the bit line control circuit SA0 (FIG. 2C) outputs a command voltage $V_{SET}$ (e.g., $V_{SET-min}+V_{BIAS}$) onto the bit line BL0A, the bit line control circuit SA1 outputs a command voltage 0V (i.e., ground) onto the bit line BL1A, the bit line control circuit SA2 outputs a command voltage $V_{BIAS}$ (e.g., $|V_{RESET}|$) onto the bit line BL2A, and the bit line control circuit SA3 outputs a command voltage $V_{READ}$ (e.g., $V_{READ-min}+V_{BIAS}$) onto bit line BL3A. Note that the column select control signal CS1 is set to a low voltage, and therefore bit lines BL0B, BL1B, BL2B, and BL3B float at a precharge voltage, which is equal to $V_{BIAS}$ (e.g., $|V_{RESET}|$) in some embodiments. Since the source line SL is set to $V_{BIAS}$ (e.g., $|V_{RESET}|$), the voltage across the terminals of resistive memory element in the RRAM cell at the intersection of the word line WL0 and the bit line BL0A is $V_{SET-min}$ (e.g., 0.25V), the voltage across the resistive memory element in the RRAM cell at the intersection of the word line WL0 and the bit line BL1A is $-|V_{RESET-min}|$ (e.g., −0.08V), the voltage across the resistive memory element in the RRAM cell at the intersection of the word line WL0 and the bit line BL2A is 0V, and the voltage across the resistive memory element in the RRAM cell at the intersection of the word line WL0 and the bit line BL3A is $V_{READ-min}$ (e.g., 0.04V). Note that FIG. 3 illustrates a write operation followed by a read operation for the sake of clarity. As discussed in this example, the write and read operations may be performed concurrently in the same memory operation phase. In FIG. 3, a precharge operation performed between the write and read operations restores the bit line voltages to $V_{BIAS}$.

In some circumstances, the one or more memory operation commands received include memory operation commands to concurrently write data to a first RRAM cell and a second RRAM cell in the array of RRAM cells, wherein the data to be written to the first RRAM cell corresponds to a set operation being performed on the first RRAM cell, and wherein the data to be written to the second RRAM cell corresponds to a reset operation being performed on the second RRAM cell (408). In these circumstances, the word line corresponding to the first RRAM cell and the second RRAM cell is enabled. A first bit line control signal that instructs a first bit line control circuit for a first bit line corresponding to the first RRAM cell to output a set voltage (i.e., $V_{SET}$) and a second bit line control signal that instructs a second bit line control circuit for a second bit line corresponding to the second RRAM cell to output a reset voltage (i.e., $V_{RESET}$) is concurrently sent, so that, concurrently, the first RRAM cell is set and the second RRAM cell is reset.

In some embodiments, the one or more memory operation commands received include memory operation commands to concurrently write data to a first RRAM cell and read data from a second RRAM cell in the array of RRAM cells, wherein the data to be written to the first RRAM cell corresponds to a set operation being performed on the first RRAM cell (410). In these embodiments, the word line corresponding to the first RRAM cell and the second RRAM cell is enabled. A first bit line control signal that instructs a first bit line control circuit for a first bit line corresponding to the first RRAM cell to output a set voltage (i.e., $V_{SET}$) and a second bit line control signal that instructs a second bit line control circuit for a second bit line corresponding to the second RRAM cell to output a read voltage (i.e., $V_{READ}$) are concurrently sent, so that, concurrently, the first RRAM cell is set and the second RRAM cell is read.

In some embodiments, the one or more memory operation commands received include memory operation commands to concurrently write data to a first RRAM cell and read data from a second RRAM cell in the array of RRAM cells, wherein the data to be written to the first RRAM cell corresponds to a reset operation being performed on the first RRAM cell (412). In these embodiments, the word line corresponding to the first RRAM cell and the second RRAM cell are enabled. A first bit line control signal that instructs a first bit line control circuit for a first bit line corresponding to the first RRAM cell to output a reset voltage (i.e., $V_{RESET}$) and a second bit line control signal that instructs a second bit line control circuit for a second bit line corresponding to the second RRAM cell to output a read voltage (i.e., $V_{READ}$) are concurrently sent, so that, concurrently, the first RRAM cell is reset and the second RRAM cell is read.

In some embodiments, a respective bit line control circuit performs a respective memory operation on a plurality of RRAM cells across a plurality of bit lines in the array of RRAM cells.

This biasing technique therefore allows concurrent setting and resetting of RRAM cells on a respective word line without requiring negative voltages. Additionally, since the source line is biased to the same voltage for both write (e.g., set and/or reset operations) and read operations, either type of memory operation may be performed for RRAM cells corresponding to the activated word line. Furthermore, a read operation may be performed on a first RRAM cell corresponding to an activated word line concurrently with a write operation (e.g., either a set operation or a reset operation) performed on a second RRAM cell corresponding to the activated word line.

In some embodiments, method 400 is governed, at least in part, by instructions that are stored in a non-transitory computer readable storage medium and that are executed by one or more processors or state machines of an electronic device. In these embodiments, one or more of the operations shown in FIG. 4 corresponds to instructions stored in a non-transitory computer readable storage medium. The computer readable storage medium may include a magnetic or optical disk storage device, solid state storage devices such as Flash memory, or other non-volatile memory device or devices. The instructions stored on the computer readable storage medium are in source code, assembly language code, object code, or other instruction format that is interpreted and/or executable by one or more processors or state machines.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the disclosed subject matter and the practical applications thereof, to thereby enable others to best utilize the disclosed subject matter and the various embodiments described with various modifications as are suited to the particular use contemplated.

What is claimed is:

1. A method for operating an array of resistive random access memory (RRAM) cells, the method comprising:
   enabling a word line corresponding to a first RRAM cell and a second RRAM cell;
   applying a non-negative bias voltage to a source line corresponding to the first RRAM cell and the second RRAM cell; and
   concurrently (i) performing a set operation on the first RRAM cell by generating a set voltage on a first bit line corresponding to the first RRAM cell, and (ii) performing a reset operation on the second RRAM cell by generating a reset voltage on a second bit line corresponding to the second RRAM cell, wherein the set voltage is positive relative to the bias voltage and the reset voltage is negative relative to the bias voltage.

2. The method of claim 1, further comprising:
   receiving a set memory operation command for the first RRAM cell; and performing the set operation on the first RRAM cell responsive to receiving the set memory operation command.

3. The method of claim 2, further comprising:
receiving a reset memory operation command for the second RRAM cell; and
performing the reset operation on the second RRAM cell responsive to receiving the reset memory operation command.

4. The method of claim 3, further comprising:
performing a precharge operation prior to receiving the set memory operation command and the reset memory operation command.

5. The method of claim 1, further comprising:
performing a precharge operation prior to performing the set operation and the reset operation.

6. The method of claim 1, wherein the set operation places the first RRAM cell in a low resistance state and the reset operation places the second RRAM cell in a high resistance state.

7. The method of claim 1, wherein the set voltage is generated by a bit line control circuit for the set operation.

8. The method of claim 7, wherein the set voltage and the non-negative bias voltage are non-negative relative to ground.

9. The method of claim 1, wherein the reset voltage is generated by a bit line control circuit for the reset operation.

10. The method of claim 9, wherein the reset voltage and the non-negative bias voltage are non-negative relative to ground.

11. A system comprising:
at least one processor; and
a memory controller configured to receive instructions from the at least one processor and perform a method for operating an array of resistive random access memory (RRAM) cells, the method comprising:
enabling a word line corresponding to a first RRAM cell and a second RRAM cell;
applying a non-negative bias voltage to a source line corresponding to the first RRAM cell and the second RRAM cell; and
concurrently (i) performing a set operation on the first RRAM cell by generating a set voltage on a first bit line corresponding to the first RRAM cell, and (ii) performing a reset operation on the second RRAM cell by generating a reset voltage on a second bit line corresponding to the second RRAM cell, wherein the set voltage is positive relative to the bias voltage and the reset voltage is negative relative to the bias voltage.

12. The system of claim 11, wherein the instructions when executed further cause the system to perform:
receiving a set memory operation command for the first RRAM cell; and
performing the set operation on the first RRAM cell responsive to receiving the set memory operation command.

13. The system of claim 12, wherein the instructions when executed further causes the system to perform:
receiving a reset memory operation command for the second RRAM cell; and
performing the reset operation on the second RRAM cell responsive to receiving the reset memory operation command.

14. The system of claim 13, wherein the instructions when executed further causes the system to perform:
performing a precharge operation prior to receiving the set memory operation command and the reset memory operation command.

15. The system of claim 11, wherein the set operation places the first RRAM cell in a low resistance state and the reset operation places the second RRAM cell in a high resistance state.

16. A non-transitory medium storing instructions, that when executed by a processor of a computing system, cause a memory controller of the computing system to perform a method for operating an array of resistive random access memory (RRAM) cells, the method comprising:
enabling a word line corresponding to a first RRAM cell and a second RRAM cell;
applying a non-negative bias voltage to a source line corresponding to the first RRAM cell and the second RRAM cell; and
concurrently (i) performing a set operation on the first RRAM cell by generating a set voltage on a first bit line corresponding to the first RRAM cell, and (ii) performing a reset operation on the second RRAM cell by generating a reset voltage on a second bit line corresponding to the second RRAM cell, wherein the set voltage is positive relative to the bias voltage and the reset voltage is negative relative to the bias voltage.

17. The non-transitory medium of 16, wherein the instructions when executed further cause the computer system to perform:
receiving a set memory operation command for the first RRAM cell; and
performing the set operation on the first RRAM cell responsive to receiving the set memory operation command.

18. The non-transitory medium of 17, wherein the instructions when executed further cause the computer system to perform:
receiving a reset memory operation command for the second RRAM cell; and
performing the reset operation on the second RRAM cell responsive to receiving the reset memory operation command.

19. The non-transitory medium of 18, wherein the instructions when executed further cause the computer system to perform:
performing a precharge operation prior to receiving the set memory operation command and the reset memory operation command.

20. The non-transitory medium of 16, wherein the set operation places the first RRAM cell in a low resistance state and the reset operation places the second RRAM cell in a high resistance state.

* * * * *

UNITED STATES PATENT AND TRADEMARK OFFICE
CERTIFICATE OF CORRECTION

PATENT NO. : 11,373,704 B2
APPLICATION NO. : 16/890933
DATED : June 28, 2022
INVENTOR(S) : Brent Steven Haukness It is certified that error appears in the above-identified patent and that said Letters Patent is hereby corrected as shown below:

On the Title Page

Related U.S. Application Data:
(63) Continuation of application No. 16/264,438, filed on Jan. 31, 2019, now Pat. No. 10,714,173, which is a continuation of application No. 15/393,233, filed on Dec. 28, 2016, now Pat. No. 10,236,059, which is a continuation of application No. 14/240,682, filed as application No. PCT/US2012/050368 on Aug. 10, 2012, now Pat. No. 9,570,164".

Should read:
– (63) Continuation of application No. 16/264,438, filed on Jan. 31, 2019, now Pat. No. 10,714,173, which is a continuation of application No. 15/393,233, filed on Dec. 28, 2016, now Pat. No. 10,236,059, which is a continuation of application No. 14/240,682, filed on Feb. 14, 2014, now Pat. No. 9,570,164, which is a 371 of PCT/US2012/050368 filed on Aug. 10, 2012. –

Signed and Sealed this
Thirtieth Day of August, 2022

Katherine Kelly Vidal
*Director of the United States Patent and Trademark Office*